(12) United States Patent
Komaike

(10) Patent No.: US 11,477,928 B2
(45) Date of Patent: Oct. 18, 2022

(54) COMPONENT MOUNTING DEVICE

(71) Applicant: YAMAHA HATSUDOKI KABUSHIKI KAISHA, Iwata (JP)

(72) Inventor: Kunimune Komaike, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 456 days.

(21) Appl. No.: 16/619,451

(22) PCT Filed: Jun. 6, 2017

(86) PCT No.: PCT/JP2017/020970
§ 371 (c)(1),
(2) Date: Dec. 4, 2019

(87) PCT Pub. No.: WO2018/225151
PCT Pub. Date: Dec. 13, 2018

(65) Prior Publication Data
US 2020/0163264 A1 May 21, 2020

(51) Int. Cl.
*H05K 13/04* (2006.01)
*H05K 13/00* (2006.01)
(Continued)

(52) U.S. Cl.
CPC ..... *H05K 13/0419* (2018.08); *H05K 13/0069* (2013.01); *H05K 13/02* (2013.01); *H05K 13/0812* (2018.08); *Y10T 29/53174* (2015.01)

(58) Field of Classification Search
CPC ............... H05K 13/021; H05K 13/022; H05K 13/0408; H05K 13/0417; H05K 13/0419;
(Continued)

(56) References Cited

U.S. PATENT DOCUMENTS 6,317,972 B1 * 11/2001 Asai ................... H05K 13/0812
29/407.04
2006/0291713 A1 12/2006 Moriya et al.

FOREIGN PATENT DOCUMENTS

| CN | 1708218 A | 12/2005 |
| CN | 1751550 A | 3/2006 |

(Continued)

OTHER PUBLICATIONS

An Office Action; "Notice of Reasons for Refusal," mailed by the Japanese Patent Office dated Nov. 24, 2020, which corresponds to Japanese Patent Application No. 2019-523240 and is related to U.S. Appl. No. 16/619,451 with English language translation.
(Continued)

*Primary Examiner* — Peter Dungba Vo
*Assistant Examiner* — Joshua D Anderson
(74) *Attorney, Agent, or Firm* — Studebaker & Brackett PC

(57) ABSTRACT

A component mounting device includes a component supply device that supplies a component to a component supply position by using a component housing tape, a head unit provided with a suction nozzle that can be moved up and down, a first image capturing unit that captures the component supplied to the component supply position, and a component posture determination unit that determines the posture of the component supplied to the component supply position. Based on a captured image captured by the first image capturing unit, the component posture determination unit determines whether the component takes an abnormal posture protruding from a component housing part in a direction intersecting the vertical direction on a horizontal plane in the component housing tape.

6 Claims, 16 Drawing Sheets

(51) Int. Cl.
*H05K 13/02* (2006.01)
*H05K 13/08* (2006.01)

(58) Field of Classification Search
CPC ........... H05K 13/0812; H05K 13/0813; H05K 13/086; Y10T 29/49131; Y10T 29/53174; Y10T 29/53178; Y10T 29/53191
See application file for complete search history.

(56) References Cited

FOREIGN PATENT DOCUMENTS

| | | |
|---|---|---|
| CN | 1885014 A | 12/2006 |
| CN | 103339031 A | 10/2013 |
| CN | 104080324 A | 10/2014 |
| CN | 104427853 A | 3/2015 |
| EP | 3 154 327 A1 | 4/2017 |
| JP | H08-293700 A | 11/1996 |
| JP | 2015-090925 A | 5/2015 |
| JP | 2015-230912 A | 12/2015 |
| JP | 2016-153165 A | 8/2016 |
| WO | 2016/157287 A1 | 10/2016 |

OTHER PUBLICATIONS

An Office Action mailed by the China National Intellectual Property Administration dated Jun. 29, 2020, which corresponds to Chinese Patent Application No. 201780091567.6 and is related to U.S. Appl. No. 16/619,451 with English language translation.
International Search Report issued in PCT/JP2017/020970; dated Sep. 12, 2017.

* cited by examiner

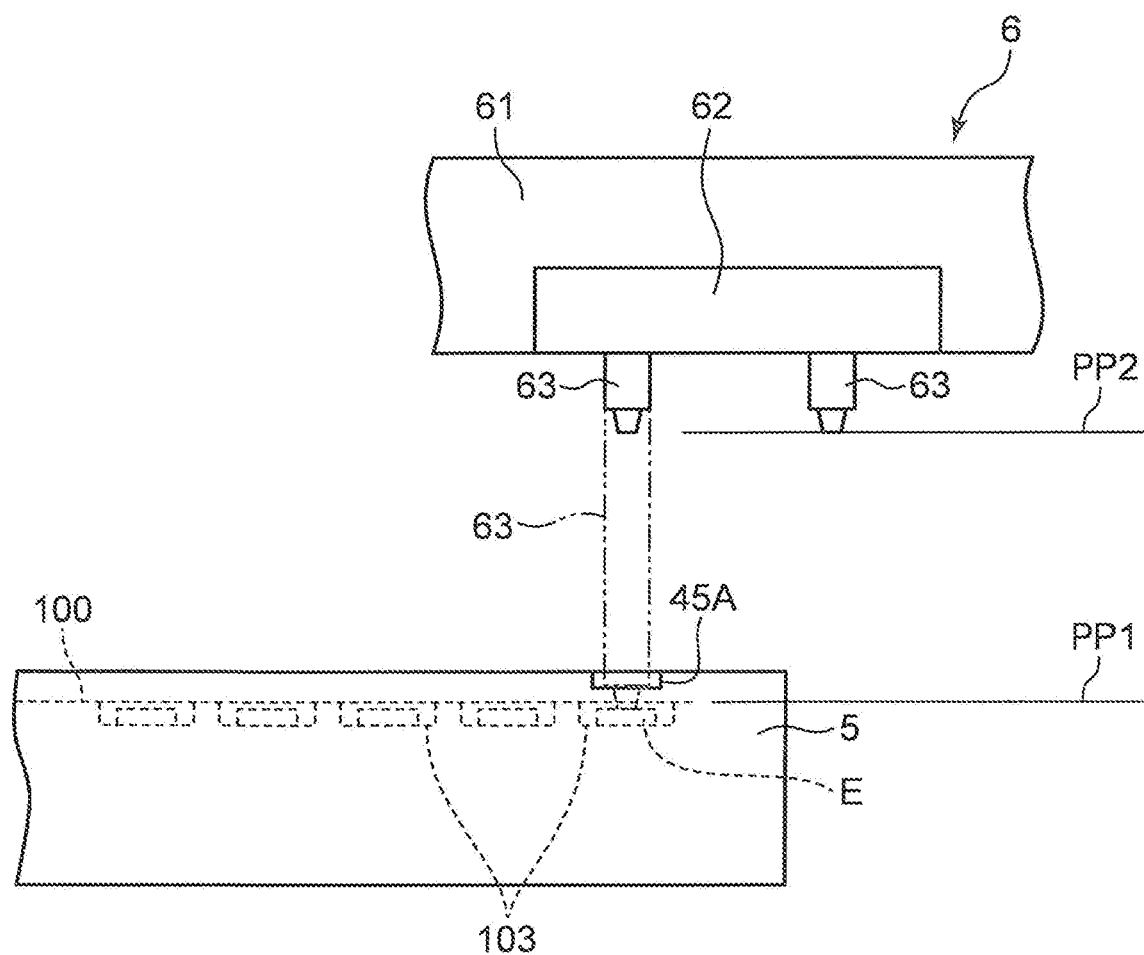

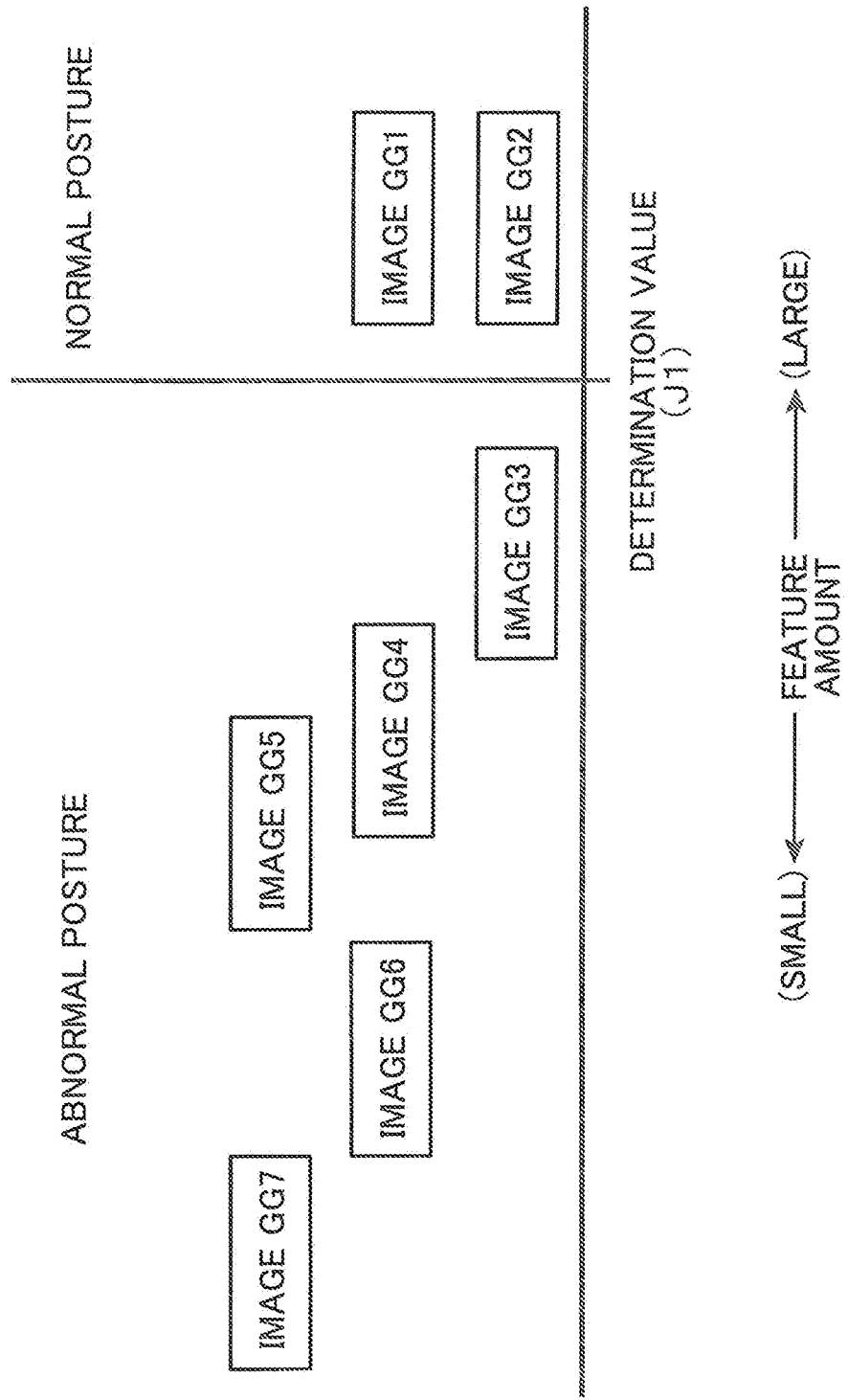

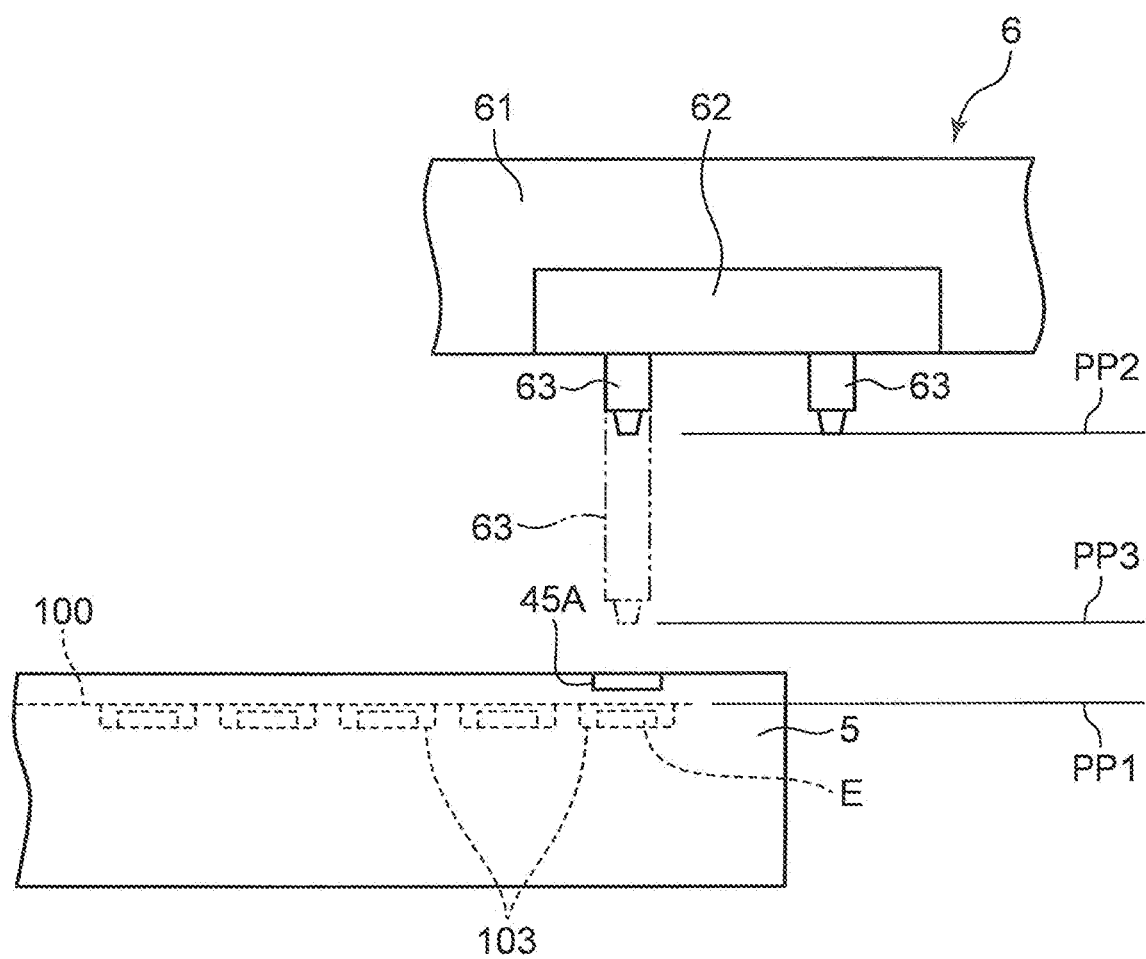

COMPONENT MOUNTING DEVICE

CROSS-REFERENCE TO RELATED APPLICATION

This application is a National Stage of International Patent Application No. PCT/JP2017/020970, filed Jun. 6, 2017, the entire content of which is incorporated herein by reference.

BACKGROUND

Technical Field

The present disclosure relates to a component mounting device that mounts components housed in component housing parts on a substrate.

BACKGROUND ART

A component mounting device for placing electronic components (hereinafter simply referred to as "components") on a substrate such as a printed wiring board includes a component supply device that supplies components to component supply positions and a head unit including a holder that holds the components supplied to the component supply positions. As the component supply device, a device that uses a component housing tape in which a plurality of component housing parts that houses the components are arranged, and a device that uses a palette on which trays with a plurality of component housing parts arranged in a matrix are placed are known.

When each component is held by the holder of the head unit, the posture of the component supplied to the component supply position by the component supply device may be a problem. That is, when the posture of the component supplied to the component supply position is abnormal with respect to the component housing part, the holder may not be able to reliably hold the component in the abnormal posture.

For example, Japanese Patent Application Laid-Open No. 2015-230912 discloses a technique to detect an abnormality in the posture of the component supplied to the component supply position by the component supply device before the holding operation of the component by the holder. The technique disclosed in Japanese Patent Application Laid-Open No. 2015-230912 captures an image of the component supplied to the component supply position, and detects an abnormality in the posture of the component in the component housing part based on the captured image. An abnormal posture of the component is detected when a long side of the component is oblique or substantially perpendicular with respect to a bottom surface of the component housing part within the component housing part, the component has a standing posture, and the component protrudes upward from an upper opening of the component housing part.

Meanwhile, the component supplied to the component supply position by the component supply device may take not only the above-mentioned standing posture but also an abnormal posture of protruding in a direction intersecting the vertical direction (direction on a horizontal plane) from the component housing part. The holder also cannot reliably hold such a component in an abnormal posture protruding in a direction on a horizontal plane from the component housing part.

SUMMARY

The present disclosure has been made in view of such a circumstance. Thus, the present disclosure provides a component mounting device having a function to determine whether the component supplied to the component supply position by the component supply device takes an abnormal posture in which reliable holding by the holder is impossible.

A component mounting device according to one aspect of the present disclosure includes a component supply device configured to supply a component to a component supply position by using a component housing member in which a plurality of component housing parts each housing the component are arranged; a head unit in which a holder that holds the component supplied to the component supply position is provided movably up and down in a vertical direction; an image capturing unit configured to capture from above the component supplied to the component supply position to acquire a captured image; and a component posture determination unit configured to determine, based on the captured image, whether the component takes an abnormal posture protruding from each of the component housing parts in a direction intersecting the vertical direction.

The object, features, and advantages of the present disclosure will be more apparent from the following detailed description and the accompanying drawings.

BRIEF DESCRIPTION OF THE DRAWINGS

FIG. 8 is a view for describing an up-and-down operation of a suction nozzle provided in the head unit;

FIG. 14 is a diagram for describing the method for determining the posture of the component by the component posture determination unit;

FIG. 15 is a view for describing the up-and-down operation of the suction nozzle when the component takes an abnormal posture.

DETAILED DESCRIPTION

A component mounting device according to an embodiment of the present disclosure will be described below with reference to the drawings. Note that the following will describe a direction relationship by using XYZ rectangular coordinate axes. The X direction is a direction parallel to a horizontal plane. The Y direction is a direction orthogonal to the X direction on the horizontal plane. The Z direction is a vertical direction orthogonal to both the X and Y directions. One direction side of the X direction is referred to as "+X side", and the other direction side opposite to the one direction side of the X direction is referred to as "−X side." One direction side of the Y direction is referred to as "+Y side", and the other direction side opposite to the one direction side of the Y direction is referred to as "−Y side." One direction side of the Z direction is referred to as "+Z side", and the other direction side opposite to the one direction side of the Z direction is referred to as "−Z side."

Structure of Component Mounting Device

Figure 1:
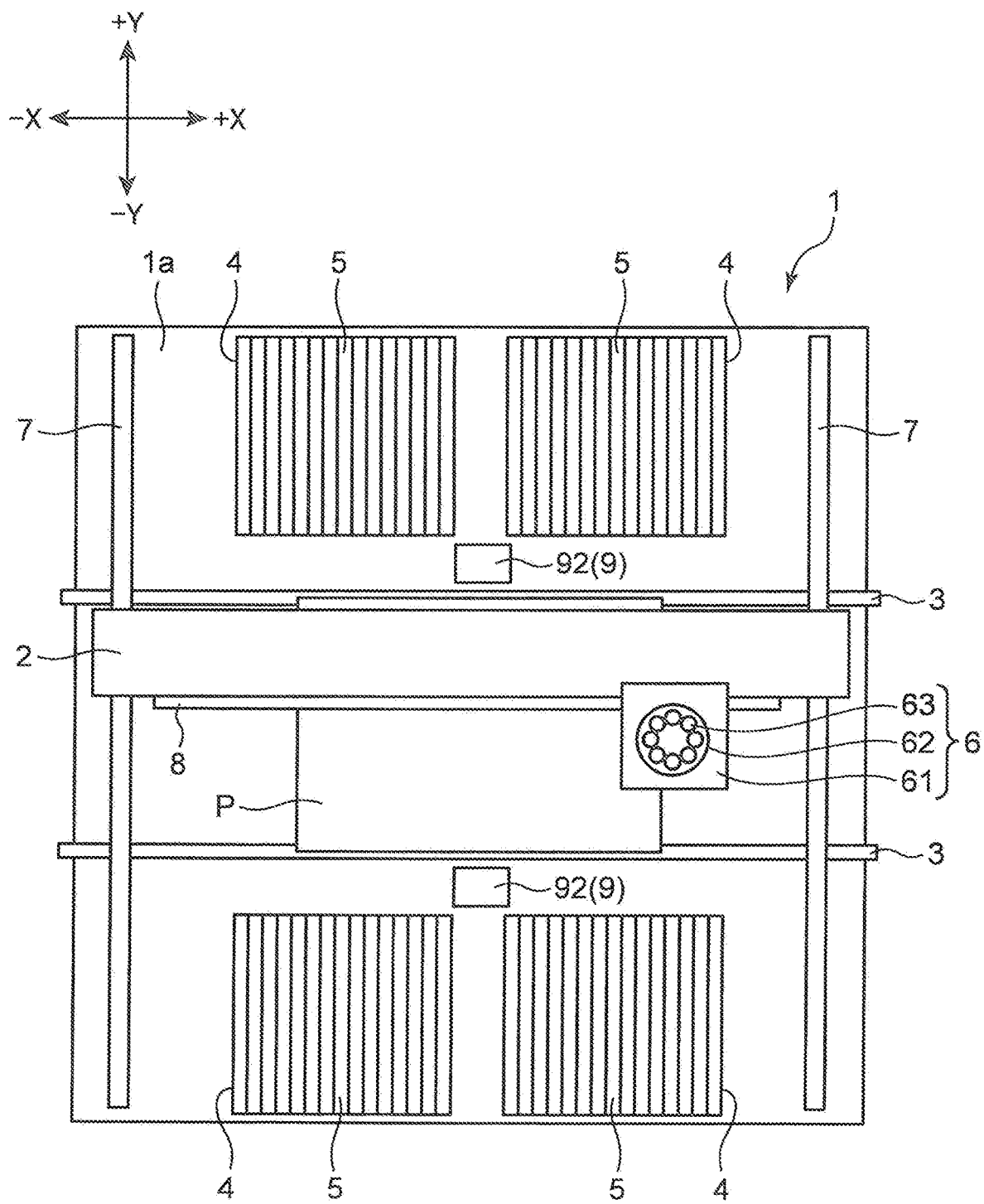
FIG. 1 is a plan view showing a configuration of a component mounting device according to one embodiment of the present disclosure.

FIG. 1 is a plan view showing a configuration of a component mounting device 1 according to one embodiment of the present disclosure. The component mounting device 1 is a device that places (mounts) components on a substrate P to produce an electronic circuit board. The component mounting device 1 includes a device body 1a, a moving frame 2, a conveyor 3, component supply units 4 in which component supply devices 5 are installed, a head unit 6, a first drive mechanism 7, and a second drive mechanism 8.

The device body 1a is a structure in which each part constituting the component mounting device 1 is disposed, and is formed in a substantially rectangular shape in plan view as viewed from the Z direction. The conveyor 3 extends in the X direction and is disposed in the device body 1a. The conveyor 3 transports the substrate P in the X direction. The substrate P is transported on the conveyor 3 and positioned at a predetermined working position (placement position where each component is placed on the substrate P).

The component supply units 4 are arranged at a total of four places, two places in the X direction each including one place in the +Y-side area and one place in the −Y-side area of the Y direction in the device body 1a. Each of the component supply units 4 is an area where the plurality of component supply devices 5 are installed in parallel in the device body 1a. A set position of each component supply device 5 is defined for each component to be sucked by a suction nozzle 63, which is a holder provided in the head unit 6 described later.

Figure 2:
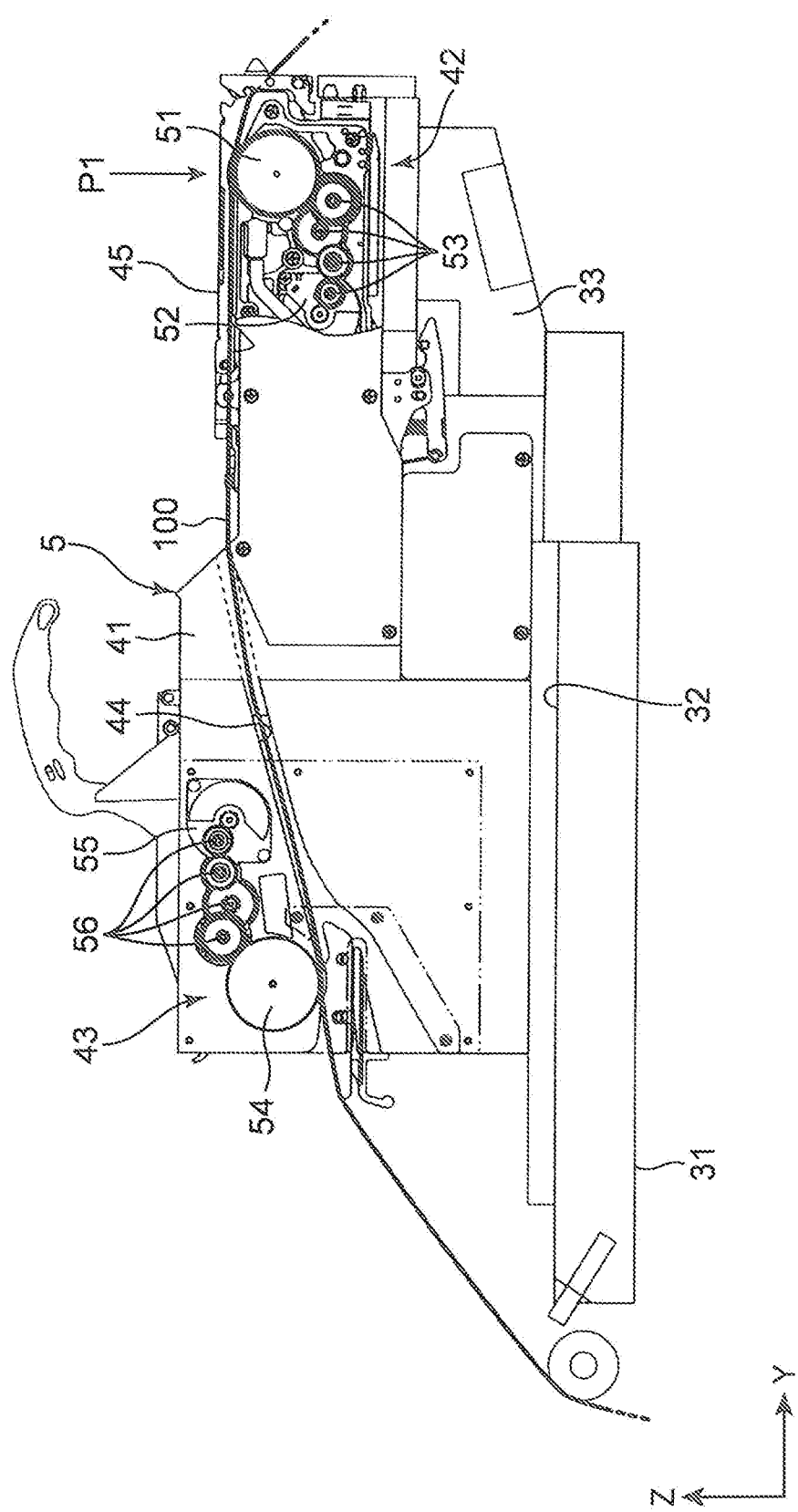
FIG. 2 is a diagram schematically showing a component supply device provided in the component mounting device.
Figure 3:
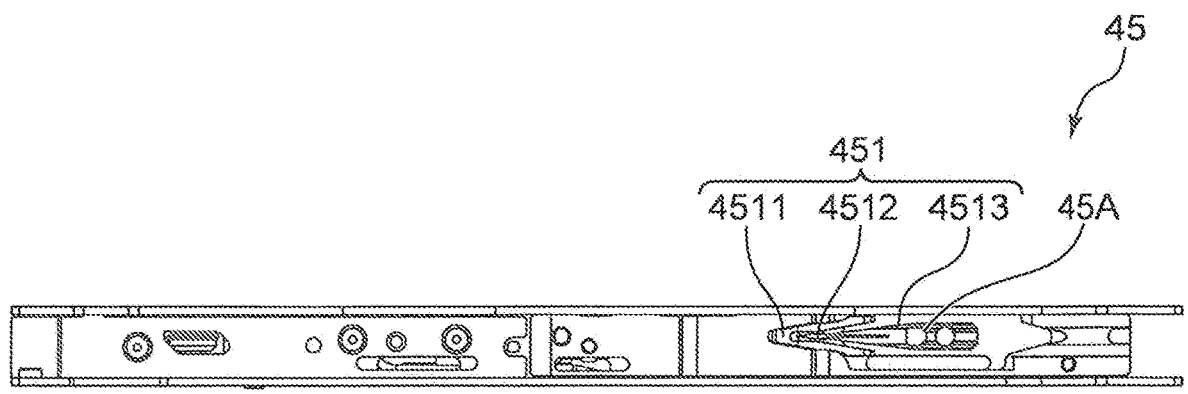
FIG. 3 is a view showing a configuration of a tape guide provided in the component supply device.
Figure 4:
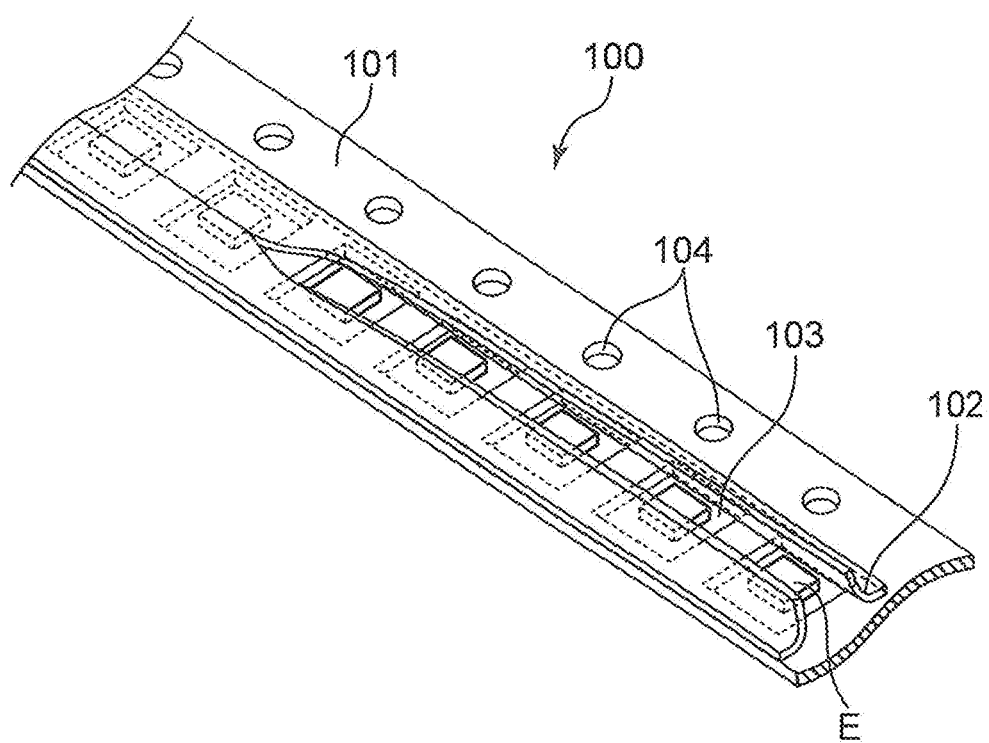
FIG. 4 is a perspective view of a component housing tape installed in the component supply device.

The component supply devices 5 are detachably installed in the component supply units 4 of the device body 1a. Each of the component supply devices 5 is a tape feeder that uses a tape as a carrier and supplies small electronic components such as ICs, transistors, and capacitors (hereinafter simply referred to as components). The component supply device 5 will be described with reference to FIGS. 2 to 4. FIG. 2 is a diagram schematically showing the component supply device 5 provided in the component mounting device 1. FIG. 3 is a view showing a configuration of a tape guide 45 provided in the component supply device 5. FIG. 4 is a perspective view of a component housing tape 100 installed in the component supply device 5.

The component supply device 5 is attached to an attachment part 31 provided in the component supply unit 4. The attachment part 31 is provided with a plurality of slots 32 arranged at regular intervals in the X direction and extending in parallel to one another in the Y direction, and a fixing base 33 extending in the X direction at a position forward of the slots 32. Then, the component supply device 5 is set in each slot 32, and each component supply device 5 is fixed to the fixing base 33. With this configuration, the plurality of component supply devices 5 are arranged side by side in the X direction in the component supply unit 4.

The component supply device 5 includes a body 41 having an elongated shape in the front-rear direction (Y direction). The component supply device 5 is fixed to the fixing base 33 with the body 41 inserted (set) in the slot 32.

The component supply device 5 further includes a first tape delivery part 42 provided at the front end portion of the body 41, a second tape delivery part 43 provided at the rear end portion of the body 41, a tape path 44 provided in the body 41, and the tape guide 45.

The tape path 44 is a path for guiding the component housing tape 100. The tape path 44 extends obliquely upward from the rear end toward the front upper portion of the body 41. The component housing tape 100 serving as a component housing member is introduced from the rear end into the inside of the body 41, and guided to the upper front surface of the body 41 through the tape path 44.

The component housing tape 100 is a long tape including a tape body 101 and a cover tape 102 as shown in FIG. 4. In the tape body 101, a large number of component housing parts 103 (recessed parts) opened at the top are formed at regular intervals in the longitudinal direction (tape feeding direction), and a component E is housed in each component housing part 103. The cover tape 102 is bonded to the upper surface of the tape body 101, whereby each component housing part 103 is closed by the cover tape 102. Furthermore, a plurality of fitting holes 104 that are arranged at regular intervals in the longitudinal direction and penetrate the tape body 101 in the thickness direction are provided on the side of the component housing part 103 in the tape body 101.

In the component supply device 5, the tape guide 45 is provided on the upper front surface of the body 41. The tape guide 45 covers the component housing tape 100 that has passed through the tape path 44, and guides the component housing tape 100 substantially horizontally along the upper surface of the body 41 to a component supply position P1. The component supply position P1 is a position where the head unit 6 takes out a component, and is set at a position near the front end of the upper surface of the body 41.

As shown in FIG. 3, in the tape guide 45, an opening 45A is provided at a position corresponding to the component supply position P1, and a component exposure part 451 is provided at a position rearward of the opening 45A. The component exposure part 451 exposes the component E in the component housing part 103 of the component housing tape 100 guided by the tape guide 45. The component exposure part 451 includes an insertion part 4511, a cutting part 4512, and a cover tape post-processing part 4513.

In the component exposure part 451, the insertion part 4511 is a tapered thin-plate part, guided by the tape guide 45, and inserted between the tape body 101 and the cover tape 102 of the component housing tape 100 with a tip as a free end. In the component exposure part 451, the cutting part 4512 is disposed on a downstream side from the insertion part 4511 in the tape feeding direction, and cuts the cover tape 102 in a straight line along the tape feeding direction as the component housing tape 100 travels. In the component exposure part 451, the cover tape post-processing part 4513 is disposed on a downstream side from the cutting part 4512 in the tape feeding direction, and performs processing for spreading out the cover tape 102 that is cut by the cutting part 4512. This allows the component E to be exposed within the component housing part 103 of the component housing tape 100. The component E exposed within the component housing part 103 in this way is sucked by the suction nozzle 63 of the head unit 6 in the component mounting device 1 and is taken out at the component supply position P1 through the opening 45A of the tape guide 45.

In the component supply device 5, the first tape delivery part 42 includes a first sprocket 51 disposed below the tape guide 45, a first motor 52, and a first gear group 53 including a plurality of transmission gears for transmitting driving force of the first motor 52 to the first sprocket 51. The first sprocket 51 has teeth that fit into the fitting holes 104 of the component housing tape 100 guided along the tape guide 45. That is, the first tape delivery part 42 delivers the component housing tape 100 toward the component supply position P1 by the first motor 52 driving the first sprocket 51 to rotate.

In the component supply device 5, the second tape delivery part 43 includes a second sprocket 54 disposed at the rear end of the body 41, a second motor 55, and a second gear group 56 including a plurality of transmission gears for transmitting driving force of the second motor 55 to the second sprocket 54. The second sprocket 54 faces the tape path 44 from above, and has teeth that fit into the fitting holes 104 of the component housing tape 100 guided along the tape path 44. That is, the second tape delivery part 43 delivers the component housing tape 100 forward (toward the component supply position P1) by the second motor 55 driving the second sprocket 54 to rotate.

The component housing tape 100 is intermittently delivered by the delivery parts 42 and 43 toward the component supply position P1. The component E is taken out through the opening 45A of the tape guide 45 at the component supply position P1.

Next, with reference to FIG. 1, the moving frame 2 provided in the component mounting device 1 extends in the X direction, and is supported by the device body 1a movably in a predetermined moving direction (Y direction). The head unit 6 is placed on the moving frame 2. The head unit 6 is placed on the moving frame 2 movably in the X direction. That is, the head unit 6 is movable in the Y direction as the moving frame 2 moves, and is movable in the X direction along the moving frame 2. The head unit 6 is movable between the component supply position P1 of the component supply device 5 installed in the component supply unit 4 and the predetermined working position of the substrate P transported by the conveyor 3. The head unit 6 takes out the component E from the component supply device 5 at the component supply position P1, and places the taken component E on the substrate P at the working position. Details of the head unit 6 will be described later.

The first drive mechanism 7 is disposed at +X-side and −X-side ends of the device body 1a. The first drive mechanism 7 is a mechanism that moves the moving frame 2 in the Y direction. The first drive mechanism 7 includes, for example, a drive motor, a ball screw shaft extending in the Y direction and connected to the drive motor, and a ball nut disposed in the moving frame 2 and screwed into the ball screw shaft. The first drive mechanism 7 having such a configuration moves the moving frame 2 in the Y direction by the ball nut being advanced and retracted along the ball screw shaft as the drive motor drives the ball screw shaft to rotate.

The second drive mechanism 8 is disposed in the moving frame 2. The second drive mechanism 8 is a mechanism that moves the head unit 6 in the X direction along the moving frame 2. In a similar manner to the first drive mechanism 7, the second drive mechanism 8 includes, for example, a drive motor, a ball screw shaft extending in the X direction and connected to the drive motor, and a ball nut disposed in the head unit 6 and screwed into the ball screw shaft. The second drive mechanism 8 having such a configuration moves the head unit 6 in the X direction by the ball nut being advanced and retracted along the ball screw shaft as the drive motor drives the ball screw shaft to rotate.

Note that in this example, the first drive mechanism 7 and the second drive mechanism 8 are configured to move the moving frame 2 and the head unit 6 via the ball screw shaft by the drive motor. However, the first drive mechanism 7 and the second drive mechanism 8 may be configured to directly drive the moving frame 2 and the head unit 6 by using, for example, a linear motor as a drive source.

Figure 5:
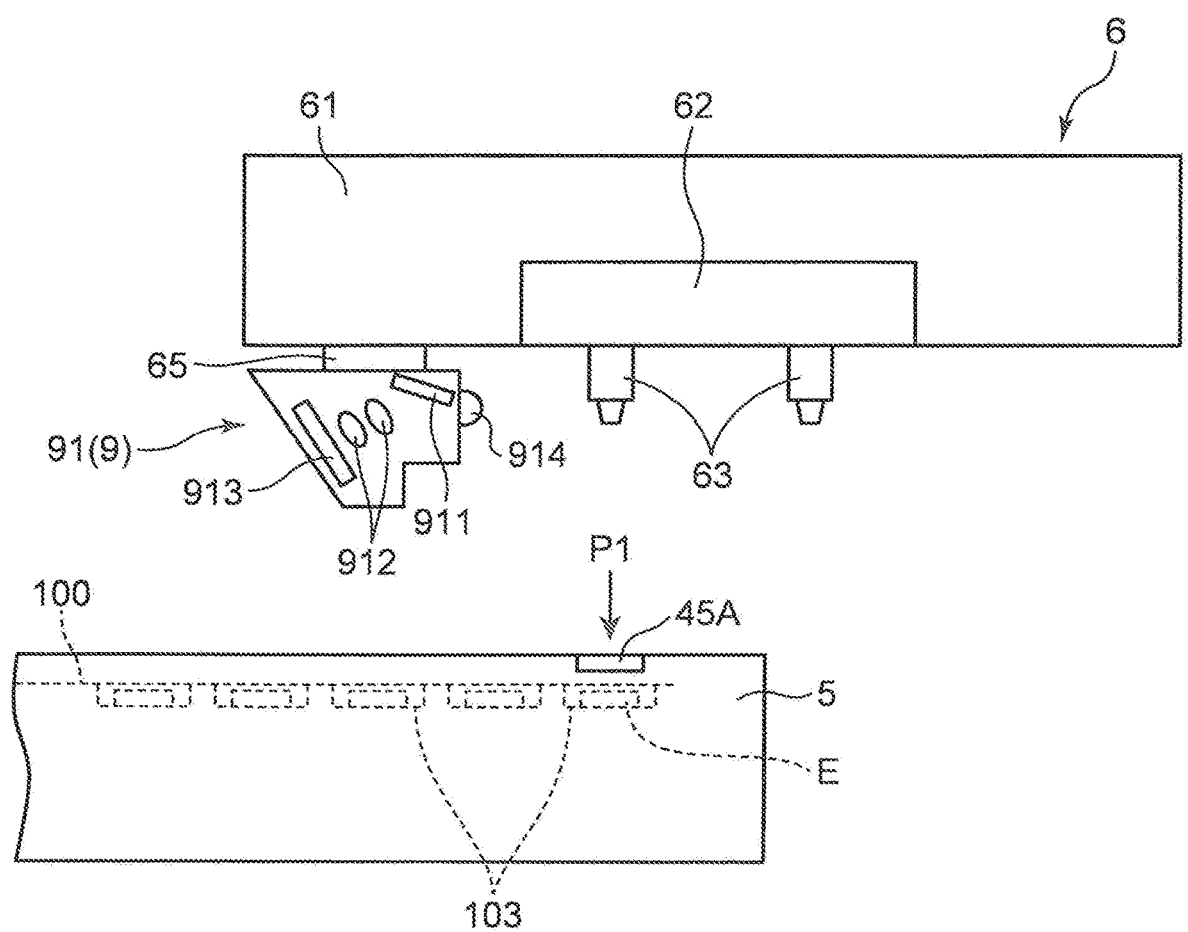
FIG. 5 is a side view of a head unit provided in the component mounting device.
Figure 6:
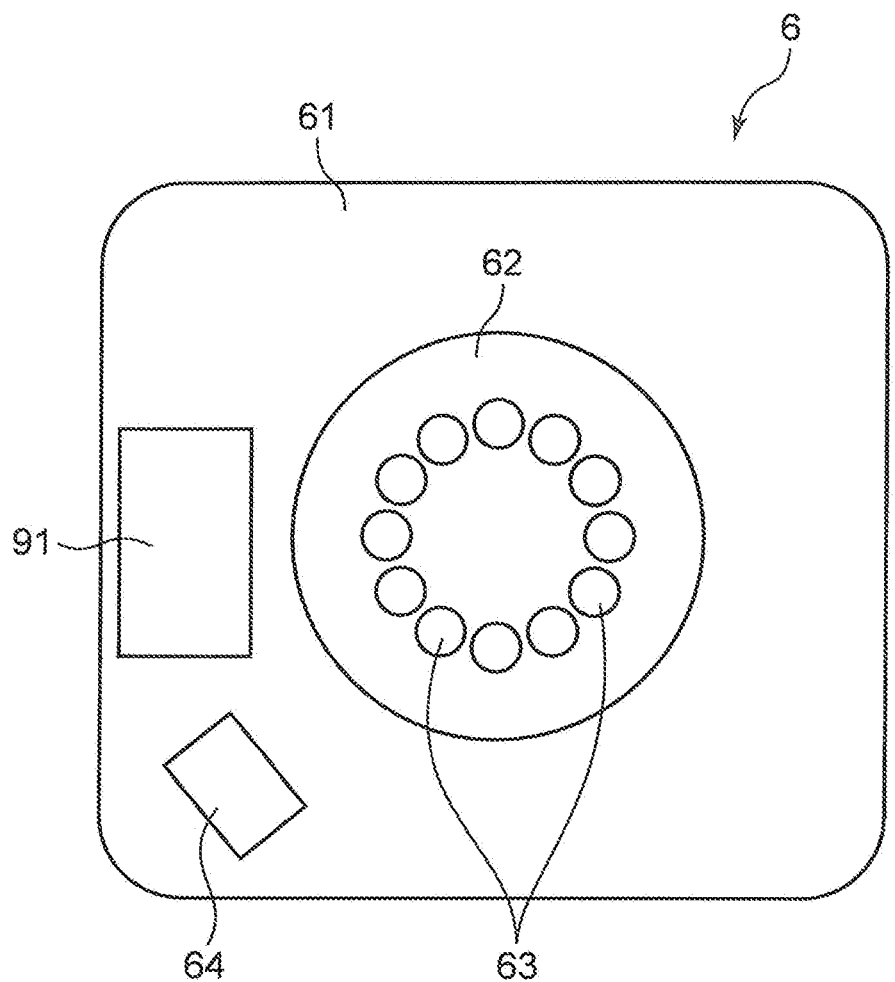
FIG. 6 is a plan view of the head unit.
Figure 7:
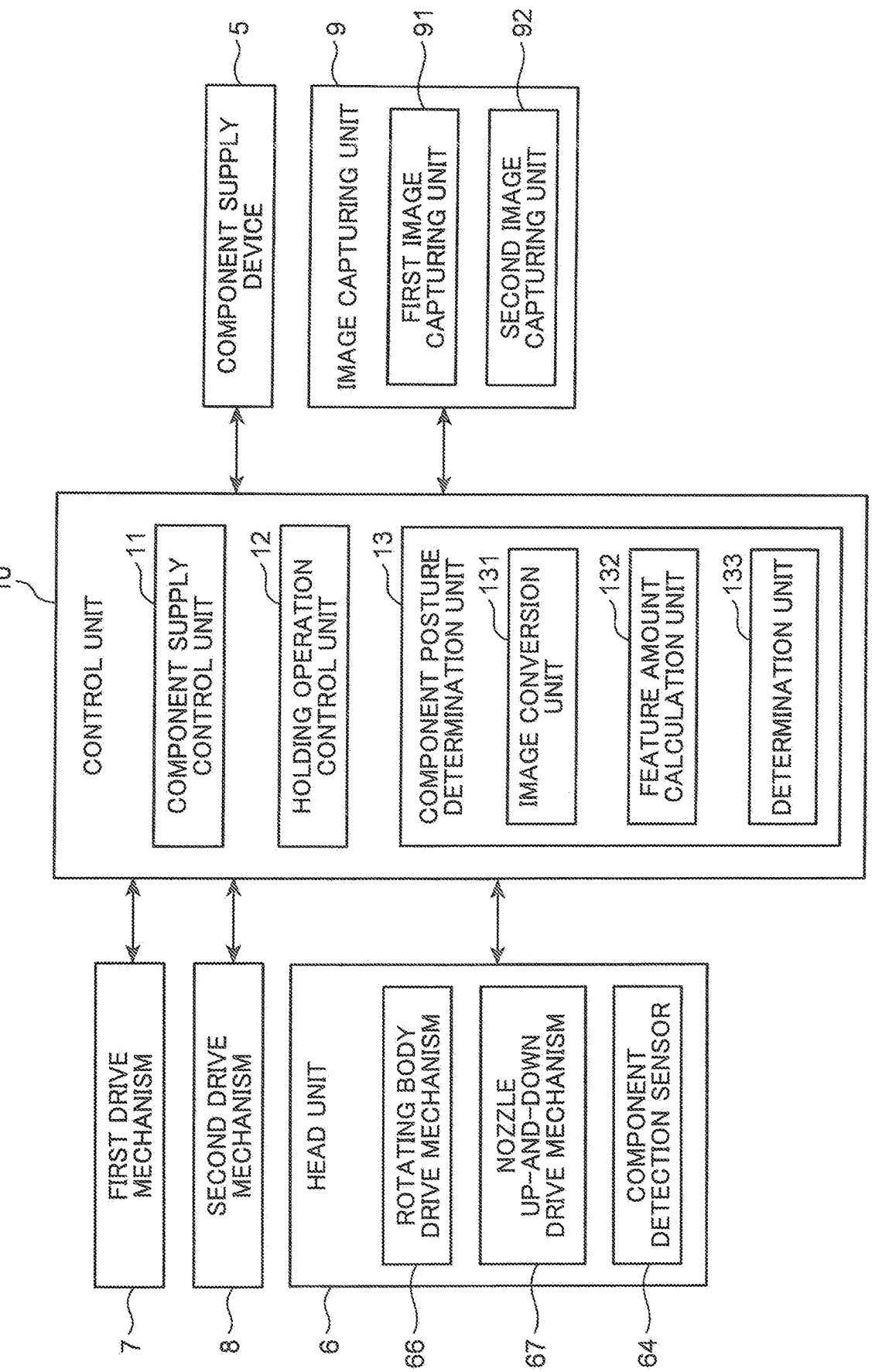
FIG. 7 is a block diagram showing a control system of the component mounting device.

The head unit 6 will be described with reference to FIGS. 5 to 8 in addition to FIG. 1. FIG. 5 is a side view of the head unit 6. FIG. 6 is a plan view of the head unit 6 viewed from below. FIG. 7 is a block diagram showing a control system of the component mounting device 1. FIG. 8 is a view for describing an up-and-down operation of the suction nozzle 63 provided in the head unit 6.

The head unit 6 includes a head body 61, a rotating body 62, and the suction nozzles 63. The head body 61 constitutes a body part of the head unit 6. The rotating body 62 is formed in a cylindrical shape, and is provided in the head body 61 so as to be rotatable about a vertical axis (axis extending in the Z direction) by a rotating body drive mechanism 66 (see FIG. 7).

The plurality of suction nozzles 63 are arranged at predetermined intervals in the circumferential direction in an outer peripheral edge of the rotating body 62. Each suction nozzle 63 is a holder that can adsorb and hold the component E supplied to the component supply position P1 by the component supply device 5. The suction nozzle 63 can communicate with either of a negative pressure generation device, a positive pressure generation device, and the atmosphere via an electric switching valve. That is, the supply of negative pressure to the suction nozzle 63 enables the adsorption and holding of the component E (taking out the component) by the suction nozzle 63. Then, the supply of positive pressure releases the adsorption and holding of the component E. Note that in the present embodiment, as the holder other than the suction nozzle 63, for example, a chuck that grips and holds the component E may be used.

The suction nozzle 63 that can move up and down in the vertical direction (Z direction) by a nozzle up-and-down drive mechanism 67 is provided on the rotating body 62 (see FIG. 7). The suction nozzle 63 is movable along the Z direction (vertical direction) between a holding position PP1 where the component E supplied to the component supply position P1 by the component supply device 5 can be held, and a retraction position PP2 on the upper side of the holding position PP1 (see FIG. 8). That is, when holding the component E supplied to the component supply position P1, the suction nozzle 63 is lowered by the nozzle up-and-down drive mechanism 67 from the retraction position PP2 toward the holding position PP1, and adsorbs and holds the component E at the holding position PP1. Meanwhile, the suction nozzle 63 that has adsorbed and held the component E is raised by the nozzle up-and-down drive mechanism 67 from the holding position PP1 toward the retraction position PP2.

In addition, as shown in FIG. 6, a component detection sensor 64 is provided on a lower surface of the head body 61 of the head unit 6. The component detection sensor 64 detects a holding state of the component E adsorbed and held by the suction nozzle 63 at the component supply position P1 of the component supply device 5. In more detail, when the suction nozzle 63 that has adsorbed and held the component E at the holding position PP1 rises to the retraction position PP2, the component detection sensor 64 detects whether the component E is adsorbed and held by the suction nozzle 63, or the posture of the component E adsorbed and held by the suction nozzle 63.

As shown in FIG. 5, on a lower surface of the head body 61 of the head unit 6, a first image capturing unit 91 is fixed to the outer side of the rotating body 62 (−X side, left side) via an attachment member 65. The first image capturing unit 91 is an image capturing camera that captures from above the component E supplied from the component supply device 5 to the component supply position P1 to acquire a captured image before the adsorption and holding operation of the component E by the suction nozzle 63. In the present embodiment, the first image capturing unit 91 captures the component E supplied to the component supply position P1 obliquely from above.

The first image capturing unit 91 includes a reflection mirror 911, a telecentric lens 912, an image capturing element 913, and an illumination unit 914.

In the first image capturing unit 91, the illumination unit 914 is, for example, a light emitting diode (LED) and illuminates the component supply position P1 of the component supply device 5. The illumination unit 914 is provided on the right-side (+X side) side surface of the first image capturing unit 91 so as to protrude to the side close to the rotating body 62. Note that the illumination unit 914 is positioned outside (−X side, left side) of the rotating body 62 that is a background of a captured image by the first image capturing unit 91.

In the first image capturing unit 91, the reflection mirror 911 reflects reflected light from the component E supplied to the component supply position P1 and the component housing part 103 housing the component E toward the telecentric lens 912. The reflected light incident on the telecentric lens 912 from the component E and the component housing part 103 is guided to the image capturing element 913. The image capturing element 913 is, for example, a complementary metal-oxide-semiconductor (CMOS) or a charge-coupled device (CCD). The image capturing element 913 generates the captured image based on the reflected light from the component E and the component housing part 103 guided through the telecentric lens 912.

The first image capturing unit 91 is disposed such that an optical axis perpendicular to the capturing surface of the image capturing element 913 and passing through the center of the telecentric lens 912 overlaps with an imaginary line that passes through the retraction position PP2 of the suction nozzle 63 (directly above the component supply position P1) and the rotation center of the rotating body 62 in plan view as viewed from the Z direction. With this configuration, the first image capturing unit 91 can acquire a captured image centered on the component supply position P1. However, the first image capturing unit 91 does not necessarily need to acquire the captured image centered on the component supply position P1, and is only required to acquire the captured image in which the entire component housing part 103 positioned at the component supply position P1 is captured.

In addition, the component mounting device 1 includes second image capturing units 92 as shown in FIG. 1. The second image capturing units 92 are component recognition cameras disposed at positions between each component supply unit 4 and the conveyor 3 on the device body 1a. Each second image capturing unit 92 captures the component E from below in order to recognize the holding state of the component E adsorbed and held by the suction nozzle 63 of the head unit 6. After the component E is adsorbed and held by the suction nozzle 63 at the component supply position P1 of the component supply device 5, when the head unit 6 is moved to the working position of the substrate P positioned on the conveyor 3, the second image capturing unit 92 captures the component E at the working position. That is, the second image capturing unit 92 captures the component E before the component E adsorbed and held by the suction nozzle 63 is placed on the substrate P at the working position. Note that the first image capturing unit 91 attached to the head unit 6 and the second image capturing unit 92 disposed on the device body 1a are collectively referred to as the image capturing unit 9.

Control System of Component Mounting Device

Next, the control system of the component mounting device 1 will be described with reference to the block diagram of FIG. 7. The component mounting device 1 includes a control unit 10. The control unit 10 includes a central processing unit (CPU), a read only memory (ROM) that stores a control program, a random access memory (RAM) used as a work area for the CPU, or the like. The control unit 10 comprehensively controls the operation of the component mounting device 1 by the CPU executing the control program stored in the ROM. The control unit 10 includes a component supply control unit 11, a holding operation control unit 12, and a component posture determination unit 13, as shown in FIG. 7.

The component supply control unit 11 controls a supply operation of the component E to the component supply position P1 by the component supply device 5.

The holding operation control unit 12 controls movement of the head unit 6 on a horizontal plane in the X direction and the Y direction by the first drive mechanism 7 and the second drive mechanism 8. Also, the holding operation control unit 12 controls the up-and-down operation of the suction nozzle 63 by the nozzle up-and-down drive mechanism 67 such that the suction nozzle 63 moves between the holding position PP1 and the retraction position PP2. Furthermore, the holding operation control unit 12 controls a rotating operation of the rotating body 62 by the rotating body drive mechanism 66.

The component posture determination unit 13 determines the posture of the component E supplied to the component supply position P1 by the component supply device 5 based on the captured image acquired by the first image capturing unit 91. Specifically, the component posture determination unit 13 determines whether the component E takes an abnormal posture protruding from the component housing part 103 in a direction intersecting the vertical direction (Z direction), for example, in a direction on a horizontal plane. When the component E does not take an abnormal posture, the component posture determination unit 13 determines that the component E takes a normal posture and is normally housed in the component housing part 103. The determination of the component posture by the component posture determination unit 13 is performed before the holding operation, by the suction nozzle 63, of the component E supplied to the component supply position P1 by the component supply device 5. Such a configuration including the component posture determination unit 13 makes it possible to implement the component mounting device 1 having a function of determining whether the component E supplied to the component supply position P1 takes an abnormal posture in which reliable holding by the suction nozzle 63 is impossible.

Figure 9A:
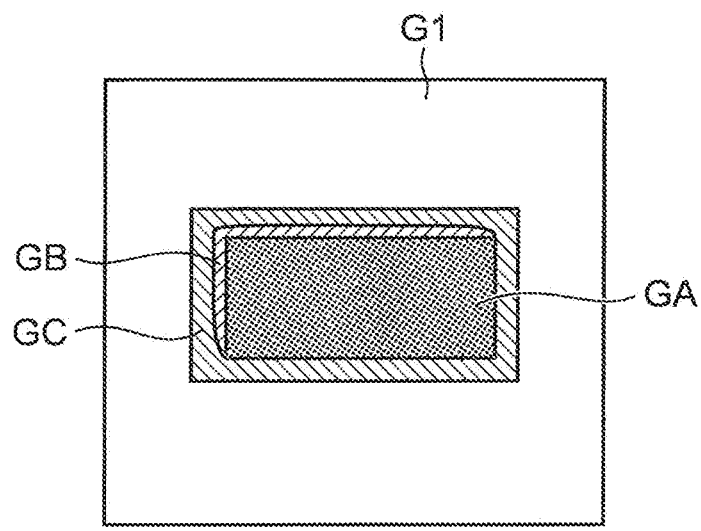
FIGS. 9A and 9B are views showing one example of captured images acquired by a first image capturing unit.
Figure 9B:
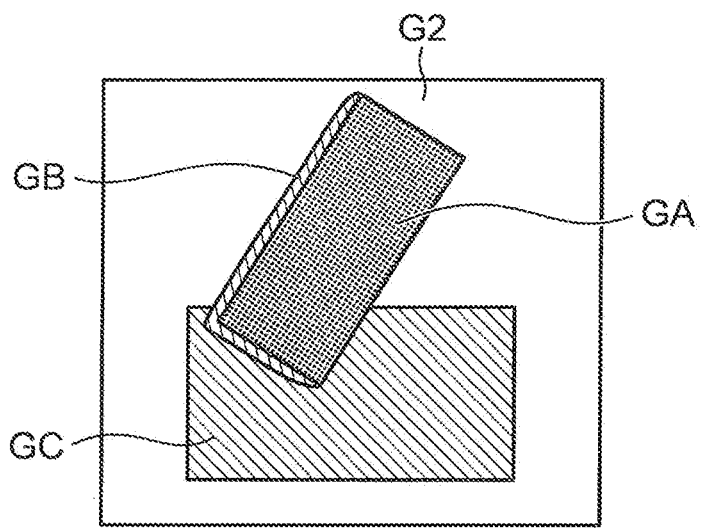

Here, the captured images used when the component posture determination unit 13 determines the component posture will be described with reference to FIGS. 9A and 9B. FIGS. 9A and 9B are views showing one example of the captured images acquired by the first image capturing unit 91. The captured image G1 of FIG. 9A shows one example of the captured image in a state where the component E takes a normal posture. The captured image G2 of FIG. 9B shows one example of the captured image in a state where the component E takes an abnormal posture.

The captured images G1 and G2 acquired by the first image capturing unit 91 each include a component area GA representing an image of the component E, a component shadow area GB representing an image of a shadow of the component E, and a housing part area GC representing an image of the component housing part 103.

The component posture determination unit 13 includes a feature amount calculation unit 132 and a determination unit 133 as shown in FIG. 7. In the component posture determination unit 13, the feature amount calculation unit 132 calculates a feature amount regarding the posture of the component E based on the component area GA, the component shadow area GB, and the housing part area GC in the captured images G1 and G2. In the component posture determination unit 13, the determination unit 133 determines whether the component E takes an abnormal posture based on the feature amount calculated by the feature amount calculation unit 132. In this aspect, the feature amount calculation unit 132 calculates the feature amount regarding the posture of the component E, with reference to not only the component area GA and the housing part area GC corresponding to the component E and the component housing part 103 included in the captured images G1 and G2, but also the component shadow area GB corresponding to the shadow of the component E. Based on the feature amount, the determination unit 133 determines the abnormal posture of the component E, thereby improving the determination accuracy of the component posture.

Figure 10:
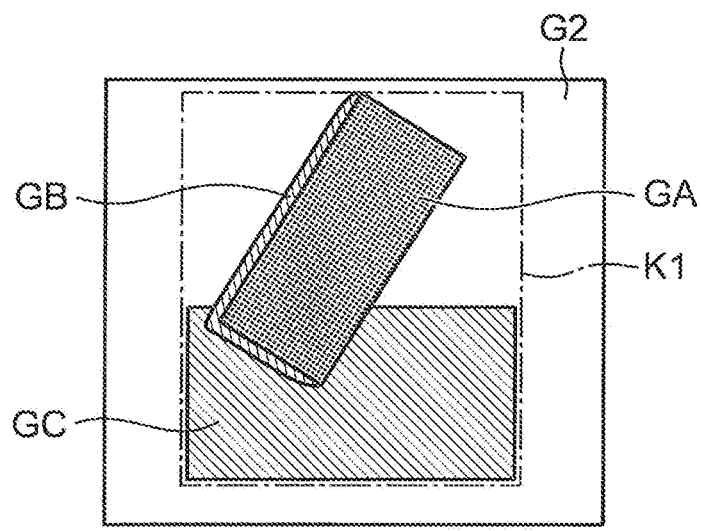
FIG. 10 is a view for describing one example of a method for determining a posture of a component by a component posture determination unit.

FIG. 10 is a view for describing one example of a method for determining the posture of the component E by the component posture determination unit 13. As the feature amount regarding the posture of the component E, the feature amount calculation unit 132 can calculate sizes such as an entire outer peripheral size including respective areas of the component area GA, the component shadow area GB, and the housing part area GC in the captured images G1 and G2, and a size of a circumscribed rectangle K1. However, when the size is used as the feature amount, the feature amount includes a constituent of the size of the component E (component size) in which dimensional variations exist. Therefore, the feature amount regarding the size is likely to cause an error due to variations in component size. As a result, there is a possibility that the determination accuracy of the component posture based on the feature amount regarding the size may decrease.

Therefore, the feature amount calculation unit 132 is preferably configured to calculate, as the feature amount, a ratio of the number of pixels of the component area GA to the number of pixels of the component shadow area GB and the housing part area GC in the captured images G1 and G2. The feature amount regarding the ratio, which is a relative indicator, is unlikely to cause an error due to variations in component size. Therefore, the determination accuracy of the component posture based on the feature amount regarding the ratio improves.

Note that based on the feature amount regarding the ratio calculated by the feature amount calculation unit 132, when determining the component posture, the determination unit 133 experimentally obtains in advance a ratio that allows discrimination of a normal posture from an abnormal posture. By using the ratio as a determination value, the determination unit 133 determines whether the component E takes an abnormal posture. The determination value used by the determination unit 133 is set for each component size.

Also, as shown in FIG. 7, the component posture determination unit 13 further includes an image conversion unit 131 that converts the captured images G1 and G2 into grayscale images. FIGS. 11A to 13B are views showing one example of the grayscale images generated by the image conversion unit 131.

Figure 11A:
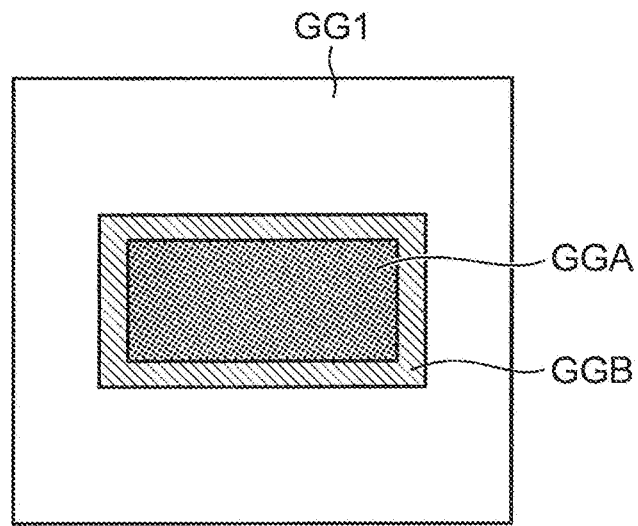
FIGS. 11A and 11B are views showing one example of grayscale images based on the captured images.
Figure 11B:
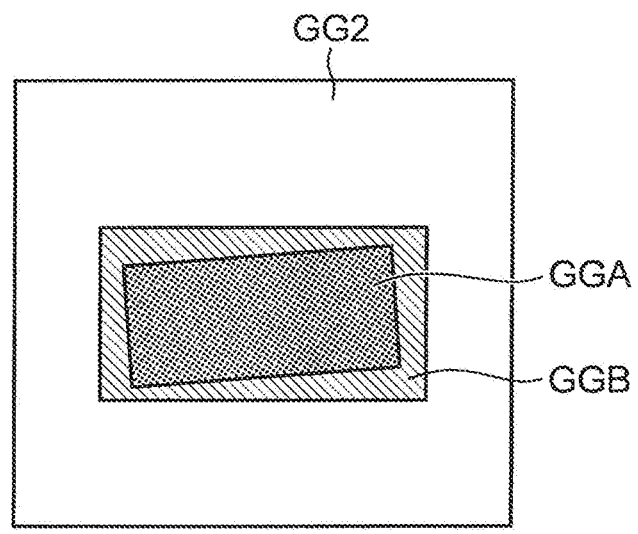

The grayscale image GG1 of FIG. 11A and the grayscale image GG2 of FIG. 11B show grayscale images converted based on the captured images in a state where the component E takes a normal posture.

Figure 12A:
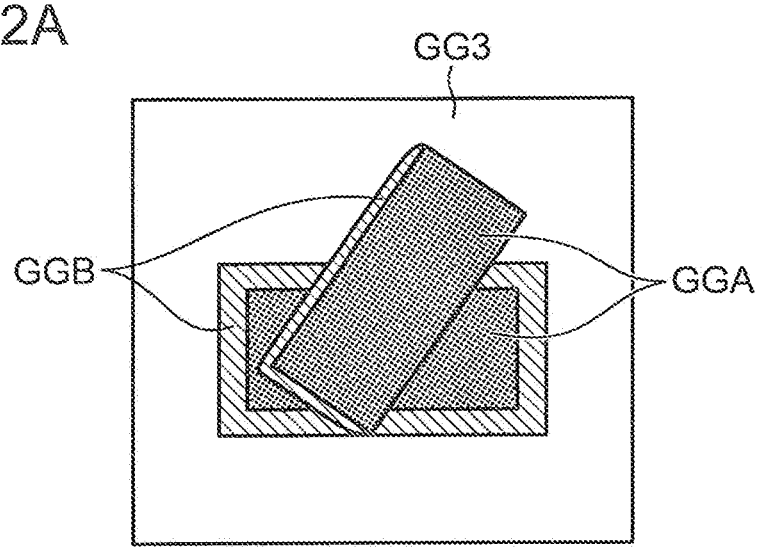
FIGS. 12A to 12C are views showing one example of grayscale images based on the captured images.
Figure 12B:
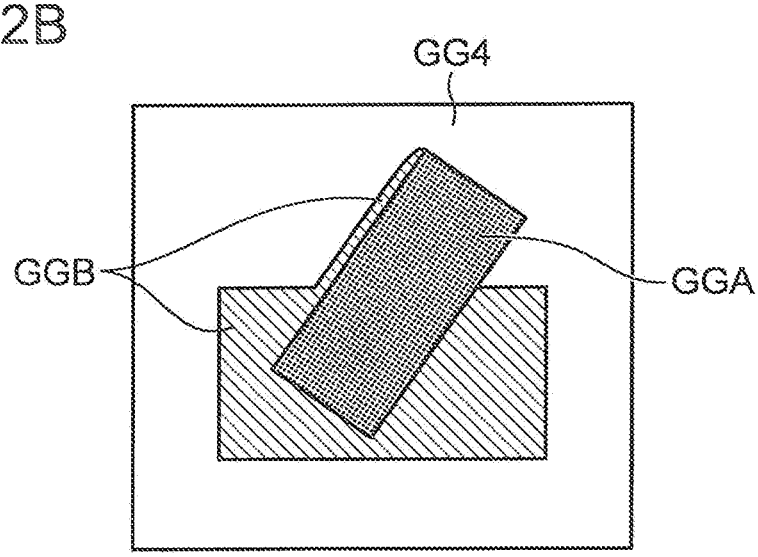
Figure 12C:
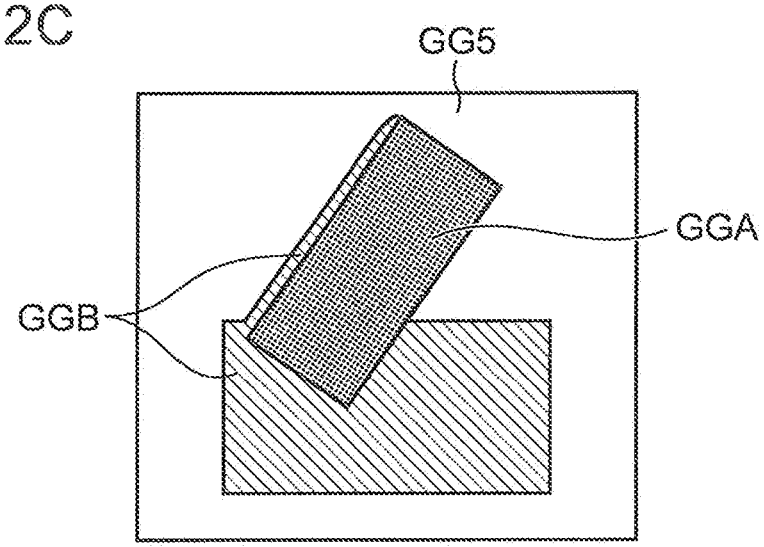

The grayscale image GG3 of FIG. 12A shows a grayscale image converted based on the captured image in a state where a component housed in another component housing part 103 overlaps a component that takes a normal posture. For such a state, the determination unit 133 determines that the component E takes an abnormal posture. The grayscale image GG4 of FIG. 12B shows a grayscale image converted based on the captured image in a state where the component E takes an abnormal posture. The grayscale image GG5 of FIG. 12C shows a grayscale image converted based on the captured image in a state where the component E takes an abnormal posture, and in a state where an amount of protrusion of the component E from the component housing part 103 is larger than that in the case of FIG. 12B.

Figure 13A:
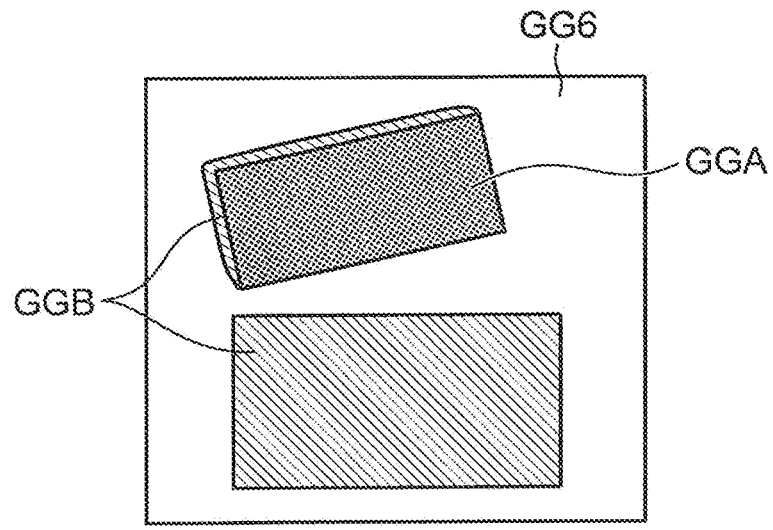
FIGS. 13A and 13B are views showing one example of grayscale images based on the captured images.
Figure 13B:
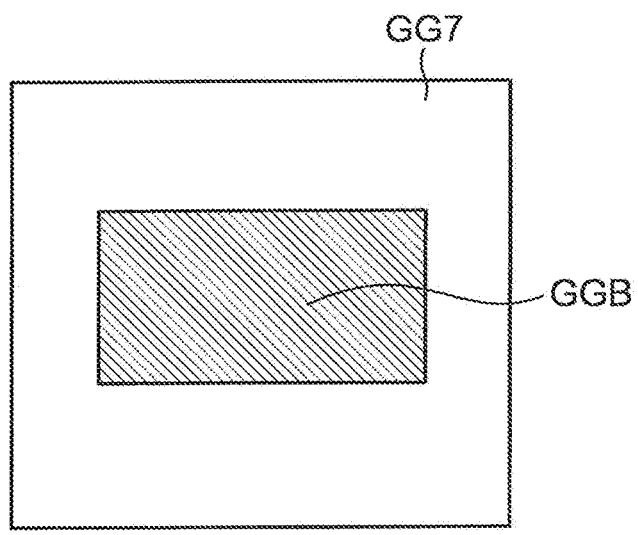

The grayscale image GG6 of FIG. 13A shows a grayscale image converted based on the captured image in a state where the component E is out of the component housing part 103. For such a state, the determination unit 133 determines that the component E takes an abnormal posture. The grayscale image GG7 of FIG. 13B shows a grayscale image converted based on the captured image in a state where the component E steps across the capturing range of the first image capturing unit 91 and is out of the component housing part 103. For such a state, the determination unit 133 determines that the component E takes an abnormal posture.

In the component posture determination unit 13, the image conversion unit 131 converts the captured image into the grayscale images GG1 to GG7 including a first pixel group GGA corresponding to the component area GA, and a second pixel group GGB corresponding to the component shadow area GB and the housing part area GC, with a luminance value of predetermined pixels constituting the component area GA as a threshold. Note that in a state shown in FIG. 13B, the grayscale image GG7 generated by the image conversion unit 131 does not include the first pixel group GGA corresponding to the component area GA.

In the grayscale images GG1 to GG7 generated by the image conversion unit 131, respective pixels constituting the first pixel group GGA have the same luminance value, and respective pixels constituting the second pixel group GGB have the same luminance value. In the grayscale images GG1 to GG7, the luminance value of respective pixels constituting the first pixel group GGA and the luminance value of respective pixels constituting the second pixel group GGB show different values.

When the grayscale images GG1 to GG7 generated by the image conversion unit 131 are 256-level grayscale images, a background portion representing the image of the rotating body 62 in the captured image is a white area portion including pixels having a luminance value of 255. In the 256-level grayscale images GG1 to GG7, the first pixel group GGA corresponding to the component area GA of the captured image includes pixels with a luminance value of 0 (zero) and is shown in black. In the 256-level grayscale images GG1 to GG7, the second pixel group GGB corresponding to the component shadow area GB and the housing part area GC of the captured image includes pixels with a predetermined luminance value selected from a range greater than 0 (zero) and less than 255, and is shown in a color between white and black (gray color).

Then, in the grayscale images GG1 to GG7, the feature amount calculation unit 132 calculates the ratio of the number of pixels of the first pixel group GGA to the number of pixels of the second pixel group GGB as the feature amount. This makes it possible to calculate the feature amount regarding the posture of the component E even without performing edge extraction processing to extract an edge that becomes a boundary where the luminance value of pixels changes. This increases the processing speed of the component posture determination processing. Here, the feature amount regarding the ratio is a value obtained by dividing the number of pixels of the first pixel group GGA by the number of pixels of the second pixel group GGB. That is, as the feature amount value regarding the ratio increases, the proportion of the first pixel group GGA in the grayscale images GG1 to GG7 increases.

The relationship between the feature amount regarding the ratio based on the grayscale images GG1 to GG7 and the component posture will be described with reference to FIG. 14. FIG. 14 is a diagram for describing a method for determining the posture of the component E by the component posture determination unit 13.

In the grayscale images GG1 to GG7, the feature amount is larger in the grayscale images GG1 and GG2 in which the component E is in a normal posture than in the grayscale images GG3 to GG7 in which the component E is in an abnormal posture. That is, as is apparent from FIGS. 11A and 11B, the proportion of the first pixel group GGA is large in the grayscale images GG1 and GG2 in which the component E is in a normal posture, and thus the feature amount is large.

Furthermore, among the grayscale images GG3 to GG7 in which the component E is in an abnormal posture, the value of the feature amount varies depending on the proportion of the first pixel group GGA in each grayscale image. As is apparent from FIGS. 12A to 12C and 13A and 13B, as the amount of protrusion of the component E from the component housing part 103 increases, the proportion of the first pixel group GGA in the grayscale image decreases. That is, as the amount of protrusion of the component E from the component housing part 103 increases, the proportion of the first pixel group GGA in the grayscale image decreases, and thus the feature amount decreases.

The relationship between the feature amount based on the grayscale images GG1 to GG7 and the component posture is summarized as follows. The feature amount decreases as the amount of protrusion of the component E from the component housing part 103 increases. The feature amount shows a larger value when the component E is in a normal posture than when the component E is in an abnormal posture. The ratio at which a normal posture and an abnormal posture can be discriminated with reference to the relationship between the feature amount and the component posture is set as a determination value J1 (see FIG. 14). Then, the determination unit 133 determines whether the component E takes an abnormal posture based on the determination value J1. The determination value J1 used by the determination unit 133 is set for each component size.

While the suction nozzle 63 is falling to move from the retraction position PP2 toward the holding position PP1 by the nozzle up-and-down drive mechanism 67 controlled by the holding operation control unit 12, the component posture determination unit 13 determines the posture of the component E supplied to the component supply position P1 by the component supply device 5. That is, instead of waiting for the falling operation of the suction nozzle 63 until the determination result of the component posture is output from the component posture determination unit 13, the component posture determination unit 13 determines the component posture during the falling operation of the suction nozzle 63 for holding the component E supplied to the component supply position P1. This eliminates the need to set a waiting period for the falling operation of the suction nozzle 63 due to the determination of the component posture. As a result, a delay in the up-and-down operation of the suction nozzle 63 by the holding operation control unit 12 can be avoided, and the substrate production speed in the component mounting device 1 can be improved.

Furthermore, until the determination result is output from the component posture determination unit 13, the holding operation control unit 12 decelerates the falling speed of the suction nozzle 63 to be lower than a predetermined reference falling speed. After the determination result is output from the component posture determination unit 13, the falling speed of the suction nozzle 63 is set at the reference falling speed. Until the determination result is output from the component posture determination unit 13, the falling speed of the suction nozzle 63 is decelerated. Therefore, the component posture determination unit 13 can reliably complete determination processing of the component posture during the falling operation of the suction nozzle 63. Meanwhile, after the determination result is output from the component posture determination unit 13, the deceleration of the falling speed of the suction nozzle 63 is released and the falling speed is returned to the reference falling speed. Consequently, an excessively long falling operation time of the suction nozzle 63 is suppressed as much as possible.

Furthermore, when the determination result indicating that the component E takes an abnormal posture is output from the component posture determination unit 13, the holding operation control unit 12 controls the up-and-down operation of the suction nozzle 63 as follows. FIG. 15 is a view for describing the up-and-down operation of the suction nozzle 63 when the component E takes an abnormal posture. When the determination result of an abnormal posture is output from the component posture determination unit 13, the holding operation control unit 12 stops the suction nozzle 63, which is falling at the reference falling speed toward the holding position PP1, at a holding disabled position PP3 on the upper side of the holding position PP1. Then, the holding operation control unit 12 raises the suction nozzle 63 toward the retraction position PP2 at a predetermined reference rising speed. The holding disabled position PP3 is a position that is on the upper side of the holding position PP1, and is a position where the holding of the component E by the suction nozzle 63 is impossible.

When the component E supplied to the component supply position P1 by the component supply device 5 takes an abnormal posture, reliable holding by the suction nozzle 63 is impossible in many cases. If the suction nozzle 63 forcibly holds the component E in an abnormal posture while the component E remains in an abnormal posture, and the suction nozzle 63 is raised in this state, there is a possibility that the component E is detached from the suction nozzle 63 during the rising operation of the suction nozzle 63. Therefore, when the determination result indicating that the component E takes an abnormal posture is output from the component posture determination unit 13, the holding operation control unit 12 stops the suction nozzle 63, which is falling at the reference falling speed toward the holding position PP1, at the holding disabled position PP3 on the upper side of the holding position PP1. This allows the suction nozzle 63 to avoid the holding operation of the component E that takes an abnormal posture.

The holding operation control unit 12 feeds back the determination result of the component posture output from the component posture determination unit 13 to the next operation control of the head unit 6 after the determination by the component posture determination unit 13. Specifically, when the determination result indicating that the component E takes a normal posture is output from the component posture determination unit 13, in the next operation control of the head unit 6, the holding operation control unit 12 controls the movement of the head unit 6 in the X direction and the Y direction by the first drive mechanism 7 and the second drive mechanism 8 such that the holding position PP1 of the suction nozzle 63 in the X direction and the Y direction matches the holding position PP1 at the time of determination by the component posture determination unit 13. With this operation, it is possible to improve the efficiency of the operation control of the head unit 6 regarding the X direction and the Y direction, and to improve the placement efficiency of the component E on the substrate P.

Meanwhile, when the determination result indicating that the component E takes an abnormal posture is output from the component posture determination unit 13, even if the determination result by the component posture determination unit 13 during the next falling of the suction nozzle 63 represents a normal posture, the holding operation control unit 12 controls the nozzle up-and-down drive mechanism 67 such that the rising speed of the suction nozzle 63 toward the retraction position PP2 after holding the component at the holding position PP1 is decelerated to be lower than the reference rising speed. This can inhibit the component E adsorbed and held by the suction nozzle 63 from detaching from the suction nozzle 63 in the rising process of the suction nozzle 63.

Figure 16:
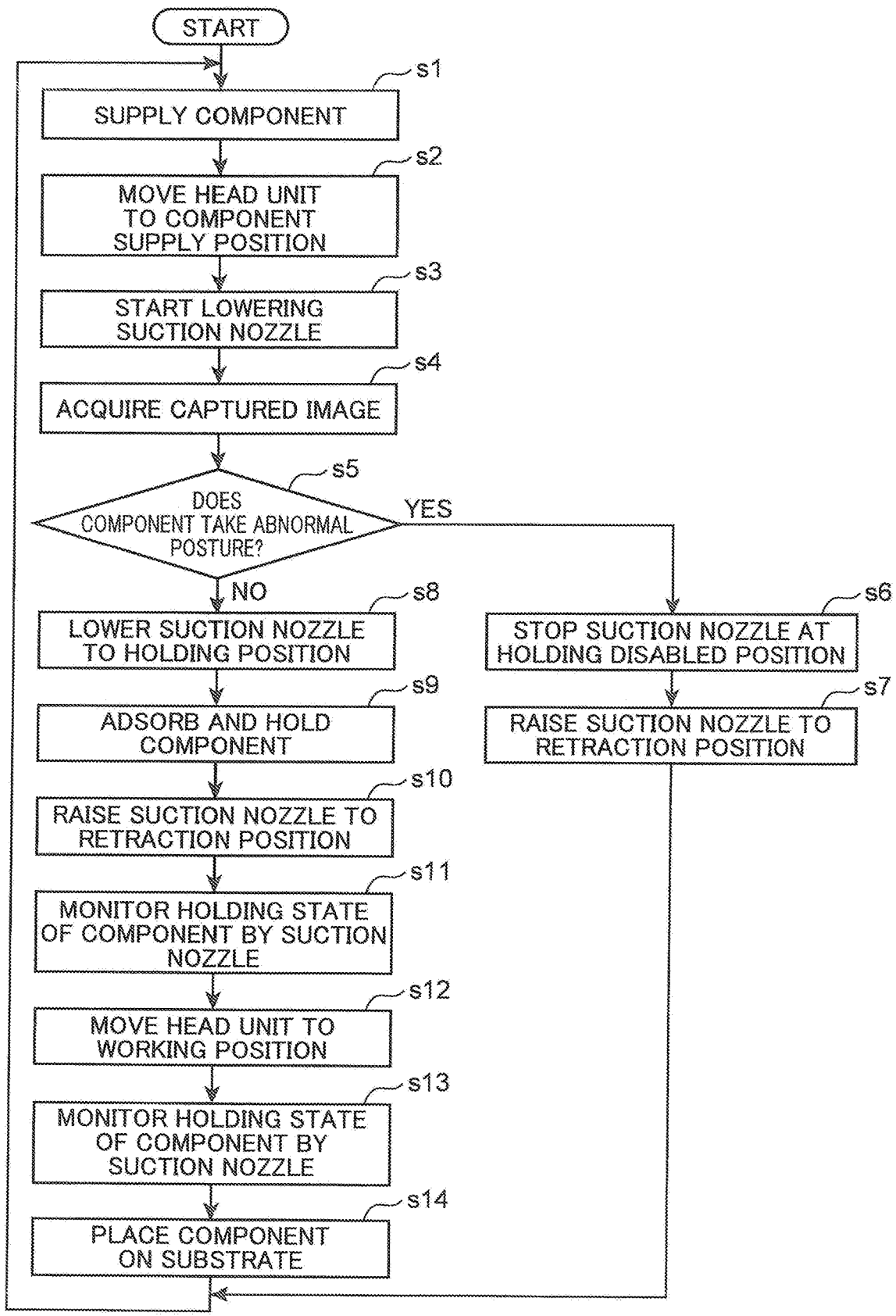
FIG. 16 is a flowchart showing a control operation of the component mounting device.

Next, the control operation of the control unit 10 in the component mounting device 1 will be described with reference to the flowchart of FIG. 16.

When a command signal for starting a placement operation of the component E on the substrate P is input by an operator's operation, the component mounting device 1 starts the placement operation. First, the substrate P is transported on the conveyor 3 and positioned at the predetermined working position. Then, in step s1, the component supply control unit 11 controls the component supply device 5. The component supply device 5 supplies the component E to the component supply position P1 by intermittently delivering the component housing tape 100.

Next, in step s2, the holding operation control unit 12 controls the movement of the head unit 6 on a horizontal plane in the X direction and the Y direction by the first drive mechanism 7 and the second drive mechanism 8. The first drive mechanism 7 and the second drive mechanism 8 move the head unit 6 such that the retraction position PP2 of the suction nozzle 63 is positioned directly above the component supply position P1.

Next, in step s3, the holding operation control unit 12 controls the up-and-down operation of the suction nozzle 63 by the nozzle up-and-down drive mechanism 67. The nozzle up-and-down drive mechanism 67 lowers the suction nozzle 63 from the retraction position PP2 toward the holding position PP1. When the suction nozzle 63 starts falling, the first image capturing unit 91 captures the component E supplied to the component supply position P1 and acquires the captured image (step s4).

When the first image capturing unit 91 acquires the captured image, during the falling operation of the suction nozzle 63, the component posture determination unit 13 determines whether the component E supplied to the component supply position P1 takes an abnormal posture (step s5). When it is determined that the component E takes an abnormal posture, the process proceeds to step s6. When it is determined that the component E takes a normal posture instead of an abnormal posture, the process proceeds to step s8. Note that until the determination result is output from the component posture determination unit 13, the holding operation control unit 12 decelerates the falling speed of the suction nozzle 63 to be lower than the predetermined reference falling speed.

When the determination result indicating that the component E takes an abnormal posture is output from the component posture determination unit 13, the holding operation control unit 12 stops the suction nozzle 63 falling toward the holding position PP1 at the holding disabled position PP3 (step s6), and then, the holding operation control unit 12 raises the suction nozzle 63 toward the retraction position PP2 (step s7).

When the determination result indicating that the component E takes a normal posture is output from the component posture determination unit 13, the holding operation control unit 12 lowers the suction nozzle 63 to the holding position PP1 (step s8). The suction nozzle 63 disposed at the holding position PP1 adsorbs and holds the component E in a normal posture supplied to the component supply position P1 (step s9). When the suction nozzle 63 adsorbs and holds the component E, the holding operation control unit 12 raises the suction nozzle 63 disposed at the holding position PP1 to the retraction position PP2 (step s10). At this time, based on detection information from the component detection sensor 64, the control unit 10 monitors whether the component E is adsorbed and held by the suction nozzle 63, or the posture of the component E adsorbed and held by the suction nozzle 63 (step s11).

When the suction nozzle 63 is raised to the retraction position PP2, the holding operation control unit 12 controls the movement of the head unit 6 on a horizontal plane in the X direction and the Y direction by the first drive mechanism 7 and the second drive mechanism 8. The first drive mechanism 7 and the second drive mechanism 8 move the head unit 6 such that the retraction position PP2 of the suction nozzle 63 is positioned directly above the working position of the substrate P on the conveyor 3 (step s12). At this time, based on the capturing result by the second image capturing unit 92, the control unit 10 monitors the holding state of the component E adsorbed and held by the suction nozzle 63 at the working position (step s13).

Then, the holding operation control unit 12 lowers the suction nozzle 63 that has adsorbed and held the component E from the retraction position PP2 and performs the placement operation of the component E on the substrate P (step s14). In this way, the component E can be placed on the substrate P.

The component mounting device according to the embodiment of the present disclosure has been described above, but the present disclosure is not limited to this embodiment, and for example, the following modified embodiment can be employed.

In the above embodiment, the component mounting device 1 including the component supply device 5 using the component housing tape 100 as the component housing member has been described. However, the present disclosure is not limited to such a configuration. The component supply device attached to the component mounting device 1 is only required to be a device that supplies the component to the component supply position by using the component housing member in which a plurality of component housing parts that each house the component are arranged. For example, the component supply device may be a device using a palette on which a tray having a plurality of component housing parts arranged in a matrix is placed. In this case, the tray is the component housing member. The component supply device using the palette will be specifically described as follows.

The component supply device using the palette is configured to supply the component in a state where the tray housing components is placed on the palette. That is, at least one tray is placed on the palette. A plurality of component housing parts are provided in a matrix on the upper surface of the tray. Each component housing part houses the component at regular intervals. A plurality of palettes configured as described above are housed in a magazine. This magazine is movably configured in the vertical direction, and the palettes housed in the magazine are moved to the component supply position during substrate production. With this configuration, the component is supplied to the component supply position while being housed in the tray on the palette.

Note that the above-described specific embodiment mainly includes the disclosure having the following configurations.

A component mounting device according to one aspect of the present disclosure includes: a component supply device configured to supply a component to a component supply position by using a component housing member in which a plurality of component housing parts each housing a component are arranged; a head unit in which a holder that holds the component supplied to the component supply position is provided movably up and down in a vertical direction; an image capturing unit configured to capture from above the component supplied to the component supply position to acquire a captured image; and a component posture determination unit configured to determine, based on the captured image, whether the component takes an abnormal posture protruding from each of the component housing parts in a direction intersecting the vertical direction.

In the component mounting device, the image capturing unit may be configured to capture the component supplied to the component supply position from obliquely above.

With this component mounting device, before a holding operation, by the holder, of the component supplied to the component supply position by the component supply device, the component posture determination unit determines the posture of the component. Based on the captured image acquired by the image capturing unit, the component posture determination unit determines whether the component supplied to the component supply position takes an abnormal posture protruding from the component housing part in the direction intersecting the vertical direction on a horizontal plane. This allows implementation of a component mounting device having a function to determine whether the component supplied to the component supply position takes an abnormal posture in which reliable holding by the holder is impossible.

In the component mounting device, the captured image may include: a component area representing an image of the component; a component shadow area representing an image of a shadow of the component; and a housing part area representing an image of each of the component housing parts, and the component posture determination unit may include: a feature amount calculation unit configured to calculate a feature amount regarding a posture of the component based on the component area, the component shadow area, and the housing part area in the captured image; and a determination unit configured to determine the abnormal posture of the component based on the feature amount.

In this aspect, the feature amount calculation unit calculates the feature amount regarding the posture of the component with reference to not only the component area and the housing part area corresponding to the component and the component housing part included in the captured image, but also to the component shadow area corresponding to the shadow of the component. Based on this feature amount, the determination unit determines the abnormal posture of the component, thereby improving the determination accuracy of the component posture.

In the component mounting device, in the captured image, the feature amount calculation unit may be configured to calculate a ratio of the number of pixels of the component area to the number of pixels of the component shadow area and the housing part area as the feature amount.

When the feature amount calculation unit calculates the feature amount based on the component area, the component shadow area, and the housing part area in the captured image, for example, the feature amount calculation unit can calculate sizes such as an entire outer peripheral size including respective areas and a size of a circumscribed rectangle as the feature amount of the posture of the component. However, when the size is the feature amount, the feature amount includes a constituent of the component size having dimensional variations. Therefore, the feature amount regarding the size is likely to cause an error due to variations in component size. As a result, there is a possibility that the determination accuracy of the component posture based on the feature amount regarding the size may decrease.

Therefore, the feature amount calculation unit calculates, as the feature amount, the ratio of the number of pixels of the component area to the number of pixels of the component shadow area and the housing part area in the captured image. The feature amount regarding the ratio, which is a relative indicator, is unlikely to cause an error due to variations in component size. Therefore, the determination accuracy of the component posture based on the feature amount regarding the ratio improves.

In the component mounting device, the component posture determination unit may further include an image conversion unit that converts the captured image into a grayscale image including a first pixel group corresponding to the component area and a second pixel group corresponding to the component shadow area and the housing part area, with a luminance value of predetermined pixels constituting the component area as a threshold. In the grayscale image, the feature amount calculation unit calculates a ratio of the number of pixels of the first pixel group to the number of pixels of the second pixel group as the feature amount.

In this aspect, the image conversion unit converts the captured image into the grayscale image, and the feature amount calculation unit calculates the ratio of the number of pixels of the first pixel group to the number of pixels of the second pixel group in the grayscale image as the feature amount. This makes it possible to calculate the feature amount regarding the posture of the component even without performing edge extraction processing to extract an edge that becomes a boundary where the luminance value of pixels changes. This increases the processing speed of the component posture determination processing.

The component mounting device may further include a holding operation control unit configured to control an up-and-down operation of the holder such that the holder moves between a holding position where the holder is capable of holding the component and a retraction position on an upper side of the holding position. While the holder is falling to move from the retraction position toward the holding position, the component posture determination unit determines the abnormal posture of the component supplied to the component supply position.

In this aspect, while the holder for holding the component supplied to the component supply position by the component supply device is falling to move from the retraction position to the holding position, the component posture determination unit determines the component posture. In other words, instead of waiting for the falling operation of the holder until the component posture determination result is output from the component posture determination unit, the component posture determination unit determines the component posture during the falling operation of the holder. This eliminates the need to set a waiting period for the falling operation of the holder due to the determination of the component posture. As a result, a delay in the up-and-down operation of the holder by the holding operation control unit can be avoided, and the substrate production speed in the component mounting device can be improved.

In the component mounting device, until a determination result is output from the component posture determination unit, the holding operation control unit decelerates a falling speed of the holder to be lower than a predetermined reference falling speed, and after the determination result is output from the component posture determination unit, the holding operation control unit sets the falling speed of the holder at the reference falling speed.

In this aspect, until the determination result is output from the component posture determination unit, the falling speed of the holder is decelerated. Therefore, the component posture determination unit can reliably complete determination processing of the component posture during the falling operation of the holder. Furthermore, after the determination result is output from the component posture determination unit, the deceleration of the falling speed of the holder is released and the falling speed is returned to the reference falling speed. Consequently, an excessively long falling operation time of the holder is suppressed as much as possible.

In the component mounting device, when the determination result indicating that the component takes the abnormal posture is output from the component posture determination unit, the holding operation control unit stops the holder that is falling at the reference falling speed toward the holding position at a holding disabled position that is a position on an upper side of the holding position and a position where holding of the component by the holder is impossible, and then, the holding operation control unit raises the holder toward the retraction position at a predetermined reference rising speed.

When the component supplied to the component supply position by the component supply device takes an abnormal posture, reliable holding by the holder is impossible in many cases. If the holder forcibly holds the component in an abnormal posture while the component remains in an abnormal posture, and the holder is raised in this state, there is a possibility that the component is detached from the holder during the rising operation of the holder. Therefore, when the determination result indicating that the component takes an abnormal posture is output from the component posture determination unit, the holding operation control unit stops the holder, which is falling at the reference falling speed toward the holding position, at the holding disabled position on the upper side of the holding position. This allows the holder to avoid the holding operation of the component that takes an abnormal posture.

As described above, the present disclosure allows implementation of the component mounting device having a function to determine whether the component supplied to the component supply position by the component supply device takes an abnormal posture in which reliable holding by the holder is impossible.

What is claimed is:

1. A component mounting device comprising:
   a component supply configured to supply a component to a component supply position by using a component housing in which a plurality of component housing parts each housing the component are arranged;
   a head unit in which a holder that holds the component supplied to the component supply position is provided movably up and down in a vertical direction;
   an imager configured to capture from obliquely above the component supplied to the component supply position to acquire a captured image; and
   a component posture determination unit configured to determine, based on the captured image, whether the component takes an abnormal posture protruding from each of the component housing parts in a direction intersecting the vertical direction, wherein
   the captured image includes: a component area representing an image of the component; a component shadow area representing an image of a shadow of the component; and a housing part area representing an image of each of the component housing parts, and
   the component posture determination unit includes;
   a feature amount calculator configured to calculate a feature amount regarding a posture of the component based on the component area, the component shadow area, and the housing part area in the captured image; and
   a determination unit configured to determine the abnormal posture of the component based on the feature amount.

2. The component mounting device according to claim 1, wherein in the captured image, the feature amount calculator is configured to calculate a ratio of a number of pixels of the component area to a number of pixels of the component shadow area and the housing part area as the feature amount.

3. The component mounting device according to claim 2, wherein
   the component posture determination unit further includes
   an image converter configured to convert the captured image into a grayscale image including a first pixel group corresponding to the component area and a second pixel group corresponding to the component shadow area and the housing part area, with a luminance value of predetermined pixels constituting the component area as a threshold, and in the grayscale image, the feature amount calculator is configured to calculate a ratio of a number of pixels of the first pixel group to a number of pixels of the second pixel group as the feature amount.

4. The component mounting device according to claim 1, further comprising a holding operation controller configured to control an up-and-down operation of the holder such that the holder moves between a holding position where the holder is capable of holding the component and a retraction position on an upper side of the holding position, wherein while the holder is falling to move from the retraction position toward the holding position, the component posture determination unit determines the abnormal posture of the component supplied to the component supply position.

5. The component mounting device according to claim 4, wherein until a determination result is output from the component posture determination unit, the holding operation controller is configured to decelerate a falling speed of the holder to be lower than a predetermined reference falling speed, and after the determination result is output from the component posture determination unit, the holding operation controller is configured to set the falling speed of the holder at the reference falling speed.

6. The component mounting device according to claim 5, wherein when the determination result indicating that the component takes the abnormal posture is output from the component posture determination unit, the holding operation controller is configured to stop the holder that is falling at the falling speed lower than the reference falling speed toward the holding position at a holding disabled position that is a position on an upper side of the holding position and a position where holding of the component by the holder is impossible, and then, the holding operation controller is configured to raise the holder toward the retraction position at a predetermined reference rising speed.

* * * * *